United States Patent [19]

Shinohara

[11] Patent Number: 5,654,673

[45] Date of Patent: Aug. 5, 1997

[54] AMPLIFIER HAVING FIELD EFFECT OR BIPOLAR TRANSISTORS AND A POWER SUPPLY VOLTAGE SUPPLIED BY A SOURCE OR EMITTER FOLLOWING RESPECTIVELY

[75] Inventor: Mahito Shinohara, Tokyo, Japan

[73] Assignee: Canon Kabushiki Kaisha, Tokyo, Japan

[21] Appl. No.: 713,369

[22] Filed: Sep. 13, 1996

Related U.S. Application Data

[63] Continuation of Ser. No. 299,403, Sep. 1, 1994, abandoned

[30] Foreign Application Priority Data

Sep. 3, 1993 [JP] Japan ................... 5-242139

[51] Int. Cl.$^6$ ................... H03F 3/16
[52] U.S. Cl. ................... 330/297; 330/277
[58] Field of Search ................... 330/149, 277, 330/297, 300

[56] References Cited

U.S. PATENT DOCUMENTS 5,045,808  9/1991  Taylor ................... 330/277
5,068,623  11/1991  Camin et al. ................... 330/297 X

FOREIGN PATENT DOCUMENTS 0327846  8/1989  European Pat. Off. .
63-186466  8/1988  Japan .
2184623  6/1987  United Kingdom .

OTHER PUBLICATIONS

IEEE Journal Of Solid–State Circuits., vol. SC–18, No. 6, Dec. 1983, New York, pp. 716–722, R.J. Van De Plassche et al. 'A Monolithic High–Speed Sample–And–Hold Amplifier For Digital Audio.'.

*Primary Examiner*—Steven Mottola
*Attorney, Agent, or Firm*—Fitzpatrick, Cella, Harper & Scinto

[57] ABSTRACT

This invention has as its object to prevent the lower limit value of the linear input range of an amplifier from being changed even when the threshold voltage of a transistor varies. In order to achieve this object, a power supply voltage to be applied to the source electrode of a field effect transistor 17 which receives an input of the amplifier is supplied by an output from a source follower 21, 22 constituted by a field effect transistor. A power supply voltage to be applied to the emitter electrode of a bipolar transistor which receives an input of the amplifier is supplied by an output from an emitter follower constituted by a bipolar transistor.

18 Claims, 4 Drawing Sheets

AMPLIFIER HAVING FIELD EFFECT OR BIPOLAR TRANSISTORS AND A POWER SUPPLY VOLTAGE SUPPLIED BY A SOURCE OR EMITTER FOLLOWING RESPECTIVELY

This application is a continuation of application Ser. No. 08/299,403 filed Sep. 1, 1994, which is now abandoned.

BACKGROUND OF THE INVENTION

1. Field of the Invention

The present invention relates to an amplifier and, more particularly, to an amplifier constituted by transistors. The present invention is suitably used as a pre-amplifier for amplifying, e.g., a sensor signal and the like.

2. Related Background Art

FIG. 3 shows an equivalent circuit diagram of a two-dimensional sensor using a conventional pre-amplifier. Referring to FIG. 3, the sensor comprises photoelectric conversion cells each constituted by a bipolar transistor 1 constituting a sensor for accumulating carriers generated upon incidence of light energy at its base, a capacitor 2 for controlling the base potential of the bipolar transistor 1, and a p-MOS transistor 3 for resetting the base potential of the bipolar transistor 1. The sensor further comprises drive lines 4 for driving each cell, vertical output lines 5 connected to the emitters of the bipolar transistors 1, buffer MOS transistors 6 each of which is selected by a vertical shift register and supplies pulses to the drive line 4 to be driven, a pulse input terminal 7 for applying drive pulses, capacitors 8 for accumulating output signal voltages from the cells, MOS transistors 9 each for switching between the vertical output line 5 and the capacitor 8, a horizontal output line 10, MOS transistors 11 each of which is selected by an output from a horizontal shift register, and transfers a signal voltage from the corresponding capacitor 8 onto the horizontal output line 10, a MOS transistor 12 for resetting the horizontal output line 10, MOS transistors 13 for resetting the sensor cells, the vertical output lines 5, and the capacitors 8, a power supply terminal 14 for applying a reset voltage as a reference voltage of this sensor system, a terminal 15 for applying pulses to the gates of the MOS transistors 9, a terminal 16 for applying pulses to the gates of the MOS transistors 13, an amplifier MOS transistor 17 whose gate is connected to the horizontal output line 10, a load MOS transistor 18 whose well and source are connected to the drain of the amplifier MOS transistor 17, and whose gate and drain are connected to the power supply voltage, a terminal 19 for applying pulses to the gate of the MOS transistor 12, and an output terminal 20 of a pre-amplifier defined by the amplifier MOS transistor 17 and the load MOS transistor 18.

FIG. 3 exemplifies the sensor having 2×2 cells for the sake of simplicity. The operation of this conventional two-dimensional sensor is described in Japanese Patent Application Laid-Open No. 63-186466.

The characteristics of the pre-amplifier defined by the MOS transistors 17 and 18 will be described below with reference to FIG. 4.

If the transconductances of the MOS transistors 17 and 18 are respectively represented by $g_{m1}$ and $g_{m2}$, the ratio $\Delta V_{out}/\Delta V_{in}$ of a change $\Delta V_{out}$ in output voltage to a change $\Delta V_{in}$ in input voltage, i.e., the gain, is given by:

$$-\sqrt{g_{m1}/g_{m2}} \qquad (1)$$

Both the MOS transistors 17 and 18 have constant transconductances $g_{m1}$ and $g_{m2}$ in a saturation region, and the amplifier output becomes linear with respect to the input. If the linear input range is assumed to be a range between $V_1$ and $V_2$, these voltages $V_1$ and $V_2$ are respectively theoretically given by $V_1 = V_{th}$ and $V_2 = V_{DD}/(1+g) + g/(1+g) \cdot V_{th}$ (where $V_{th}$ is the threshold value of the MOS transistors 17 and 18, $V_{DD}$ is the power supply voltage, and $-g$ is the gain of the amplifier). The input voltage to this amplifier ranges from $V_{VC}$ to $(V_{VC} + V_{SAT})$ (where $V_{VC}$ is the reference reset potential of the sensor and $V_{SAT}$ is the saturation voltage of the sensor). When the amplifier is set to satisfy $V_1 < V_{VC}$ and $(V_{VC} + V_{SAT}) < V_2$, as shown in FIG. 4, the sensor output can be amplified with high linearity.

However, in the above-mentioned prior art, since the threshold voltage $V_{th}$ of the MOS transistor for defining the linear input range of the pre-amplifier varies due to a variation in an element formation process or a change in operation temperature, the linear input range ($V_1$ to $V_2$) of the amplifier may deviate from the amplifier input range ($V_{VC}$ to $V_{VC} + V_{SAT}$). When $V_{VC}$ is set to be relatively high to satisfy $V_{th}$ ($= V_1$) $< V_{VC}$ even if the threshold voltage $V_{th}$ varies, and the linear input range is widened to satisfy $(V_{VC} + V_{SAT}) < V_2$, the gain g of the amplifier must be decreased.

SUMMARY OF THE INVENTION

According to the present invention, an amplifier constituted by field effect transistors is characterized in that a power supply voltage to be applied to the source electrode of a field effect transistor for receiving an input is supplied by an output from a source follower constituted by a field effect transistor.

Also, according to the present invention, an amplifier constituted by bipolar transistors is characterized in that a power supply voltage to be applied to the emitter electrode of a bipolar transistor for receiving an input is supplied by an output from an emitter follower constituted by a bipolar transistor.

According to the present invention, since the power supply voltage to be applied to the source electrode of a field effect transistor for receiving an input to an amplifier is supplied by the output from a source follower constituted by a field effect transistor, the lower or upper limit of a linear input range of the amplifier has a value lower than or higher than the lower or upper limit of an input voltage range regardless of a variation in threshold voltage of the field effect transistor, and the like.

According to the present invention, since the power supply voltage to be applied to the emitter electrode of a bipolar transistor for receiving an input to an amplifier is supplied by the output from an emitter follower constituted by a bipolar transistor, the lower or upper limit of a linear input range of the amplifier has a value lower than or higher than the lower or upper limit of an input voltage range regardless of a variation in threshold voltage of the bipolar transistor, and the like.

For example, when an input signal is assumed to be a sensor signal output from an optical sensor in a photoelectric conversion device, a voltage lower than the reset potential of the sensor by the threshold voltage value of the field effect transistor is formed using the source follower, and this voltage is supplied to the source electrode of the transistor which receives the input to the amplifier. Therefore, even when the threshold voltage of the field effect transistor varies, the lower limit value of the linear input range of the amplifier can be controlled to be unchanged, and input/output characteristics of the amplifier with a high gain and a small $V_{th}$ variation dependence can be realized.

DETAILED DESCRIPTION OF THE PREFERRED EMBODIMENTS

The preferred embodiments of the present invention will be described in detail below with reference to the accompanying drawings. The embodiments to be described below will exemplify a case wherein the present invention is applied to a pre-amplifier used in a two-dimensional sensor. However, the present invention is not limited to such an application.

FIRST EMBODIMENT

Figure 1:
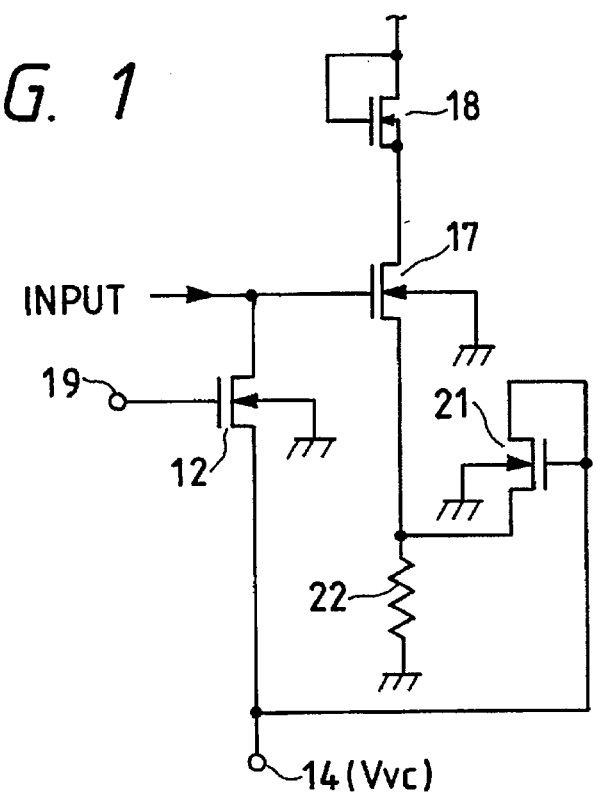
FIG. 1 is a circuit diagram showing the first embodiment of an amplifier according to the present invention.
Figure 3:
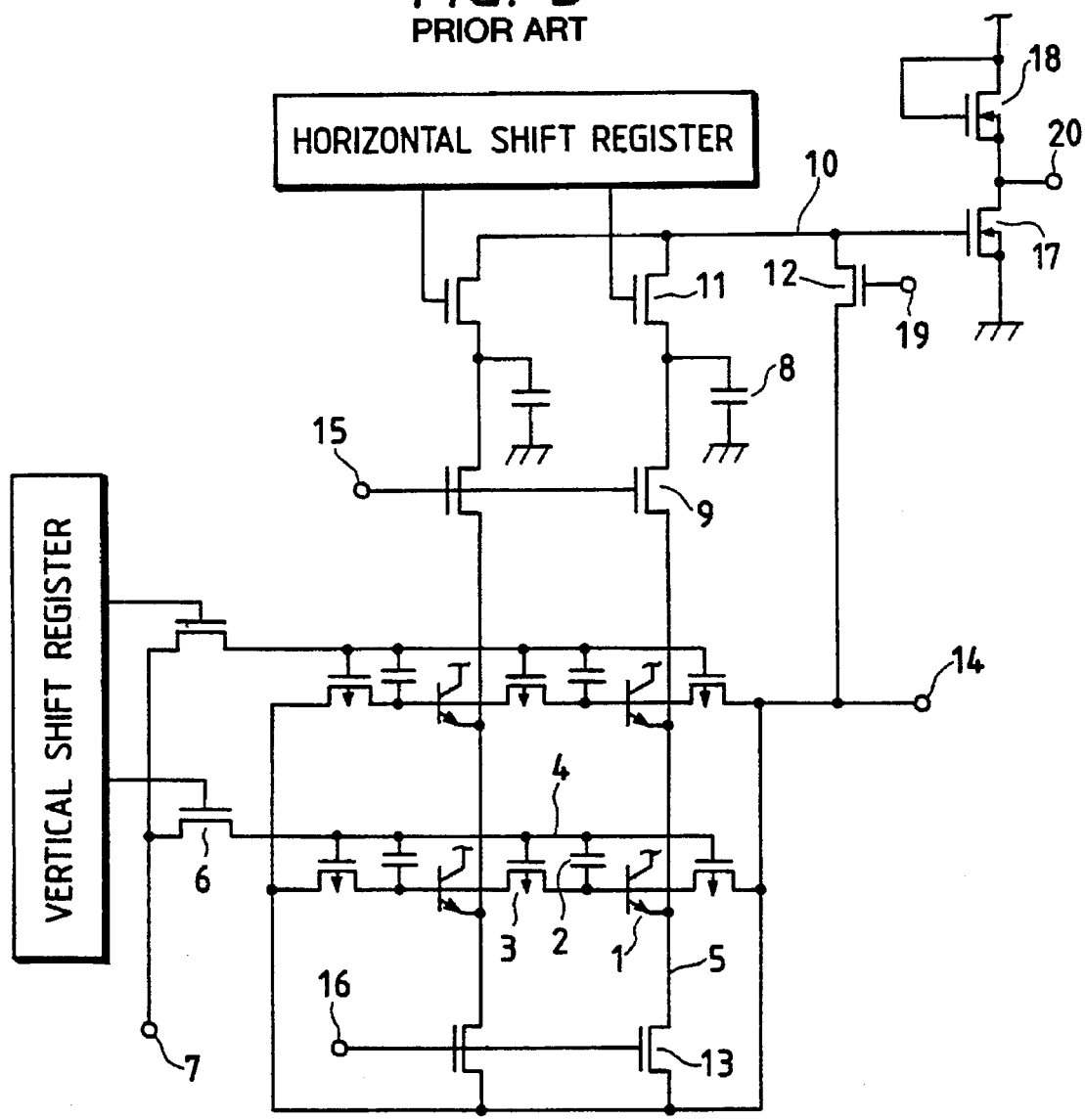
FIG. 3 is a circuit diagram showing a sensor using a conventional amplifier.
Figure 4:
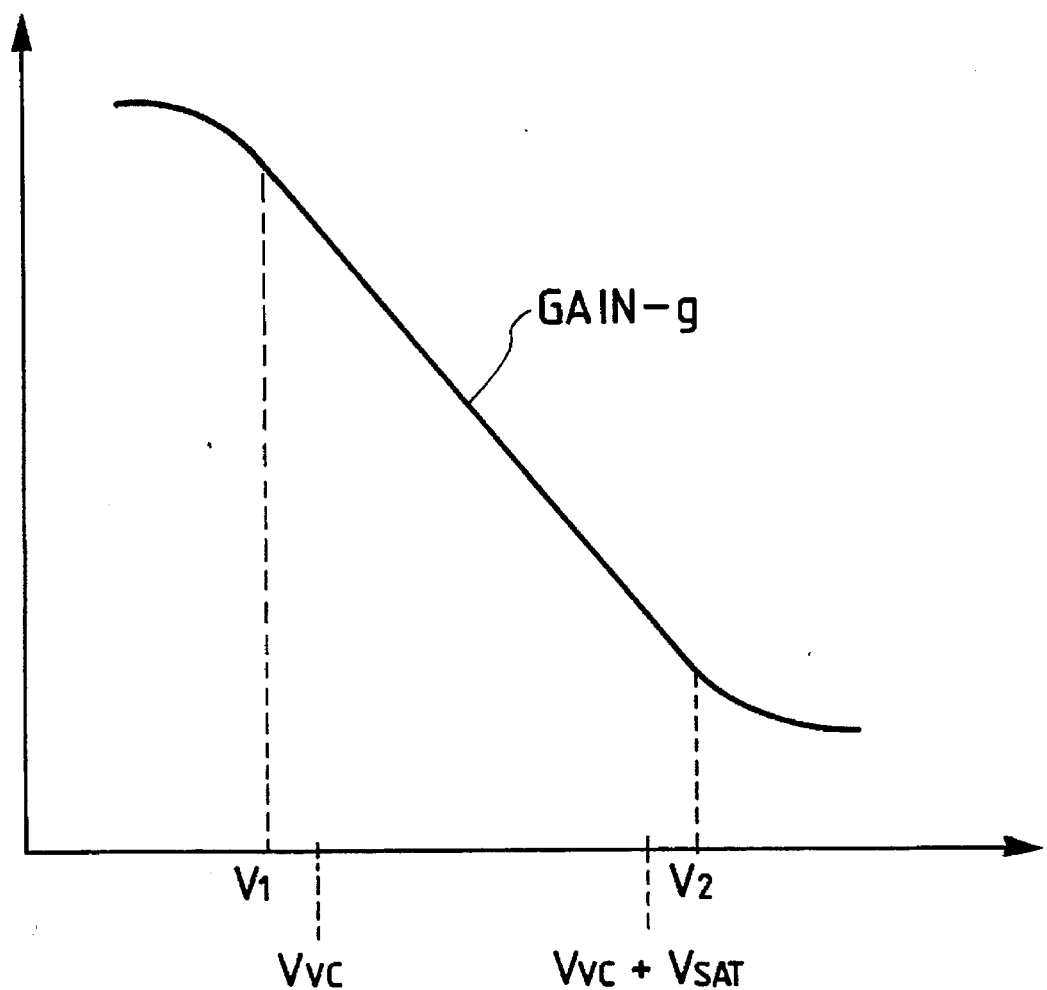
FIG. 4 is a graph showing the input/output characteristics of the amplifier.

FIG. 1 is a circuit diagram showing the first embodiment of an amplifier according to the present invention. Note that the same reference numerals in FIG. 1 denote the same parts as in FIG. 3, and a detailed description thereof will be omitted. Referring to FIG. 1, a MOS transistor 21 is connected to a resistor 22. A voltage ($V_{VC}$) of a reset power supply level of an amplifier input is applied from a terminal 14 to the gate and drain of the MOS transistor 21.

The MOS transistor 21 and the resistor 22 constitute a source follower, and the output of the source follower, i.e., the source of the MOS transistor 21 serves as a low-voltage power supply of the amplifier. If the threshold value level of the MOS transistor 21 is represented by $V_{th}$, the source follower output level is given by ($V_{VC}-V_{th}-\Delta$) (where $\Delta$ is a small voltage determined by the design value of the source follower)

When the low potential of the amplifier is determined in this manner, the lower limit of the linear input range of the amplifier is defined by ($V_{VC}-\Delta$), and always has a margin $\Delta$ from the minimum value $V_{VC}$ of the amplifier input. When a MOS transistor 17 and the MOS transistor 21 are formed at positions close each other on a single chip, the threshold values of these transistors have substantially the same variation amounts which are caused by a variation in the manufacture and a change in temperature. For this reason, large margins need not be provided to the lower limit value of the linear input range and the voltage $V_{VC}$ in consideration of a variation in threshold voltage value unlike in the prior art, and an amplifier with a large gain and a wide input range can be designed.

SECOND EMBODIMENT

Figure 2:
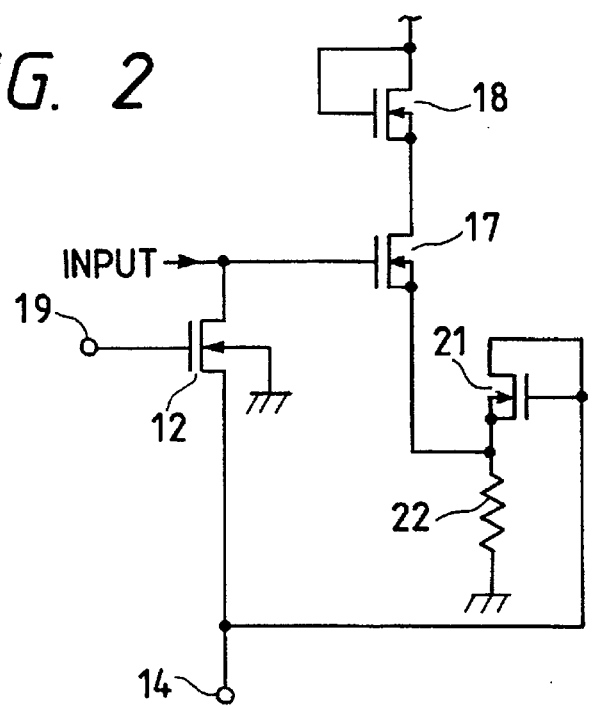
FIG. 2 is a circuit diagram showing the second embodiment of an amplifier according to the present invention.

FIG. 2 shows the second embodiment of an amplifier according to the present invention. Referring to FIG. 2, the substrate-side electrode and the source electrode of the MOS transistor 17 are connected to each other, and the substrate-side electrode and the source electrode of the MOS transistor 21 are connected to each other. In the first embodiment, the source electrode and the substrate-side electrode of a transistor 18 are connected to each other, while the MOS transistor 17 has different source and substrate potentials and is back-gate-biased. For this reason, due to different channel mobilities of the MOS transistors 17 and 18, the gain of the amplifier may be lowered. However, with the arrangement shown in FIG. 2, since the MOS transistors 17 and 18 always have the same channel mobility, the amplifier gain can be accurately designed. The input range of the amplifier becomes constant with respect to a variation in threshold voltage of the MOS transistor in the same manner as in the first embodiment.

In each of the above embodiments, the lower limit of an input voltage is set based on a predetermined reset potential. Of course, the present invention can be applied to a case wherein the upper limit of the input voltage is set based on the predetermined reset potential. For example, when n-MOS transistors as constituting elements in FIG. 1 are replaced by p-MOS transistors, a high potential $V_{DD}$ replaces GND and GND replaces the drain power supply for the transistor 18. At this time, the upper limit of an input voltage to an amplifier constituted by p-MOS transistors is set based on the reset potential.

Figure 5:
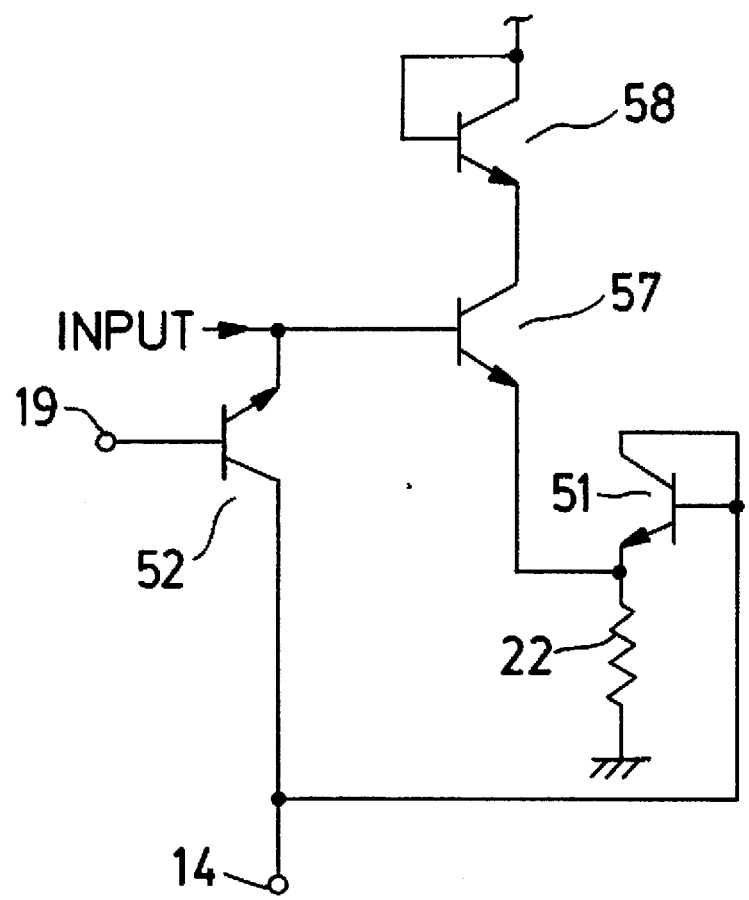
FIG. 5 is a circuit diagram showing another embodiment of an amplifier according to the present invention.

The present invention is not limited to an amplifier constituted by field effect transistors, but may be applied to an amplifier constituted by bipolar transistors such as bipolar transistors 51, 52, 57 and 58 shown in FIG. 5. In this case, the power supply voltage to be applied to the emitter electrode of a bipolar transistor 57 for receiving an input can be supplied by an output from an emitter follower constituted by a bipolar transistor 51.

As described above, according to the present invention, since the power supply voltage to be applied to the source electrode of a field effect transistor for receiving an input to an amplifier is supplied by the output from a source follower constituted by a field effect transistor, or since the power supply voltage to be applied to the emitter electrode of a bipolar transistor for receiving an input to an amplifier is supplied by the output from an emitter follower constituted by a bipolar transistor, even when the threshold value voltages of transistors constituting the amplifier deviate from a design value due to a manufacturing condition or a change in temperature, the linear input range of the amplifier can be controlled to be unchanged. For this reason, an amplifier with a high gain and a wide input range can be provided.

What is claimed is:

1. An amplifier comprising a plurality of field effect transistors, in which a power supply voltage to be applied to a source electrode of one of said plurality of field effect transistors for receiving an input to said amplifier is supplied by an output from a source follower comprising another of said plurality of field effect transistors, wherein an upper or lower limit of an input voltage is set based on a predetermined reset potential and a voltage source for setting the predetermined reset potential serves as a voltage source of said source follower and an input voltage supply source.

2. An amplifier comprising a plurality of bipolar transistors, in which a power supply voltage to be applied to an emitter electrode of one of said plurality of bipolar transistors for receiving an input to said amplifier is supplied by an output from an emitter follower comprising another of said plurality of bipolar transistors, wherein an upper or lower limit of an input voltage is set based on a predetermined reset potential, and a voltage source for setting the predetermined reset potential serves as a voltage source of said emitter follower and an input voltage supply source.

3. An amplifier, comprising:

an amplifying MOS transistor having a gate connected to an input terminal, a source and a drain;

a load MOS transistor connected to said drain of said amplifying MOS transistor; and a source follower circuit comprising (1) a MOS transistor having a gate and a drain that are short-circuited and connected to a reference potential, and a source, and (2) a resistor, one end of said resistor being connected to said source of said MOS transistor of said source follower circuit and another end of said resistor being connected to ground, wherein said source of said MOS transistor of said source follower circuit is further connected to said source of said amplifying MOS transistor, wherein said MOS transistor of said source follower circuit has an electrode at a substrate side mutually connected to said source of said MOS transistor of said source follower circuit.

4. An amplifier, comprising:

an amplifying MOS transistor having a gate connected to an input terminal, a source and a drain;

a load MOS transistor connected to said drain of said amplifying MOS transistor; and a source follower circuit comprising (1) a MOS transistor having a gate and a drain that are short-circuited and connected to a reference potential, and a source, and (2) a resistor, one end of said resistor being connected to said source of said MOS transistor of said source follower circuit and another end of said resistor being connected to ground, wherein said source of said MOS transistor of said source follower circuit is further connected to said source of said amplifying MOS transistor, wherein said input terminal connected to said amplifying MOS transistor is further selectively connected to said reference potential for resetting a voltage at said input terminal.

5. An amplifier according to claim 3, wherein said input terminal connected to said amplifying MOS transistor is further selectively connected to said reference potential for resetting a voltage at said input terminal.

6. An amplifier, comprising:

an amplifying MOS transistor having a gate connected to an input terminal, a source and a drain:

a load MOS transistor connected to said drain of said amplifying MOS transistor; and a source follower circuit comprising: a MOS transistor having a gate and a drain that are short-circuited and connected to a first reference potential, and a source; and a resistor, one end of said resistor being connected to said source of said MOS transistor of said source follower circuit and another end of said resistor being connected to a second reference potential, wherein said source of said MOS transistor of said source follower circuit is further connected to said source of said amplifying MOS transistor, wherein said MOS transistor of said source follower circuit has an electrode at a substrate side mutually connected to said source of said MOS transistor of said source follower circuit.

7. An amplifier, comprising:

an amplifying MOS transistor having a gate connected to an input terminal, a source and a drain;

a lead MOS transistor connected to said drain of said amplifying MOS transistor; and a source follower circuit comprising: a MOS transistor having a gate and a drain that are short-circuited and connected to a first reference potential, and a source; and a resistor, one end of said resistor being connected to said source of said MOS transistor of said source follower circuit and another end of said resistor being connected to a second reference potential wherein said source of said MOS transistor of said source follower circuit is further connected to said source of said amplifying MOS transistor, wherein said input terminal connected to said amplifying MOS transistor is further selectively connected to said first reference potential for resetting a voltage at said input terminal.

8. An amplifier according to claim 6, wherein said input terminal connected to said amplifying MOS transistor is further selectively connected to said reference potential for resetting a voltage at said input terminal.

9. An amplifier comprising a plurality of field effect transistors, in which a power supply voltage to be applied to a source electrode of one of said plurality of field effect transistors for receiving an input to said amplifier is supplied by an output from a source follower comprising another of said plurality of field effect transistors, wherein an upper or lower limit of an input voltage is set based on a predetermined reset potential, a voltage source for setting the predetermined reset potential serves as a voltage source of said source follower, and said one transistor and said another transistor are formed on the same chip.

10. An amplifier comprising a plurality of bipolar transistors, in which a power supply voltage to be applied to an emitter electrode of one of said plurality of bipolar transistors for receiving an input to said amplifier is supplied by an output from an emitter follower comprising another of said plurality of bipolar transistors, wherein an upper or lower limit of an input voltage is set based on a predetermined resets potential, a voltage source for setting the predetermined reset potential serves as a voltage source of said emitter follower, and said one transistor and said another transistor are formed on the same chip.

11. An amplifier according to claim 6, wherein said amplifying MOS transistor and said MOS transistor of said source follower circuit are formed on the same chip.

12. An amplifier according to claim 7, wherein said amplifying MOS transistor and said MOS transistor of said source follower circuit are formed on the same chip.

13. An amplifier comprising a plurality of field effect transistors, wherein a power supply voltage to be applied to a source electrode of a first field effect transistor for receiving an input to an amplifier is supplied by an output from a source follower comprising a third field effect transistor, a second transistor is provided at an input terminal of said first transistor for receiving the input, so that the second transistor resets the input terminal at a reference voltage, and said reference voltage is supplied also to a drain of said third transistor.

14. An amplifier according to claim 13, wherein said first transistor and said third transistor are formed on the same chip.

15. An amplifier comprising a plurality of bipolar transistors, characterized in that a power supply voltage to be applied to an emitter electrode of a first bipolar transistor for receiving an input to an amplifier is supplied by an output from an emitter follower comprising a third bipolar transistor, a second transistor is provided at an input terminal of said first transistor for receiving the input, so that the second transistor resets the input terminal at a reference voltage, and said reference voltage is supplied to a drain of said third transistor.

16. An amplifier according to claim 15, wherein said first transistor and said third transistor are formed on the same chip.

17. An amplifier according to claim 1, wherein said one transistor and said another transistor of said source follower are formed on the same chip.

18. An amplifier according to claim 2, wherein said one transistor and said another transistor of said source follower are formed on the same chip.

* * * * *

UNITED STATES PATENT AND TRADEMARK OFFICE
CERTIFICATE OF CORRECTION

PATENT NO. : 5,654,673

DATED : August 5, 1997

INVENTOR(S): MAHITO SHINOHARA

It is certified that error appears in the above-identified patent and that said Letters Patent is hereby corrected as shown below:

<u>COLUMN 3</u>

Line 39, "follower)" should read --follower).--.
    Line 45, "close" should read --close to--.

<u>COLUMN 6</u>

Line 26, "resets" should read --reset--.
    Line 55, "drain" should read --collector--.

Signed and Sealed this

Third Day of March, 1998

*Attest:*

BRUCE LEHMAN

*Attesting Officer      Commissioner of Patents and Trademarks*